United States Patent [19]

Morita et al.

[11] Patent Number: 5,390,025
[45] Date of Patent: Feb. 14, 1995

[54] METHOD OF LOCATING WORK IN AUTOMATIC EXPOSING APPARATUS

[75] Inventors: Akira Morita; Kozo Tsunoda; Takehiko Okamura, all of Tokyo, Japan

[73] Assignee: ORC Manufacturing Co., Ltd., Tokyo, Japan

[21] Appl. No.: 884,938

[22] Filed: May 18, 1992

[30] Foreign Application Priority Data

May 29, 1991 [JP] Japan .................................. 3-125991

[51] Int. Cl.⁶ ............................................ G01B 11/00
[52] U.S. Cl. ..................................... 356/400; 355/53; 29/593
[58] Field of Search ....................... 356/399, 400, 401; 33/1 M; 250/548; 29/593, 720, 721; 355/89, 99, 53; 269/73

[56] References Cited

U.S. PATENT DOCUMENTS

| | | | |
|---|---|---|---|
| 3,902,615 | 9/1975 | Levy et al. | 250/548 X |
| 3,937,579 | 2/1976 | Schmidt | 356/399 X |
| 4,787,800 | 11/1988 | Sone et al. | 269/73 X |
| 4,996,763 | 3/1991 | Sano et al. | 29/593 |
| 5,120,134 | 6/1992 | Kosugi | 356/401 |
| 5,182,615 | 1/1993 | Kurdsawa et al. | 356/400 |

FOREIGN PATENT DOCUMENTS 1-302259 12/1989 Japan .

OTHER PUBLICATIONS

Patent Abstracts Of Japan, vol. 5, No. 110; 17 Jul. 1981; Publication No. JP 56–051732 (Chiyou LSI Gijutsu Kenkyu Kumiai).
Patent Abstracts Of Japan, vol. 7, No. 27: 3 Feb. 1983; publication No. 57-183031 (Tokto Shibaura Denki).
IBM Technical Disclosure Bulletin, vol. 30, No. 12; May 1988; pp. 209–210; "Remote Location Optical Registration System".

*Primary Examiner*—Robert J. Warden
*Assistant Examiner*—E. Leigh Dawson
*Attorney, Agent, or Firm*—Longacre & White

[57] ABSTRACT

A work locating method for an automatic exposing apparatus is provided. In addition to a step of delivering a work Wa from a feed-in section onto an alignment table 13a on an alignment stand in a locating section which is provided separately from an exposing section, and subjecting the work Wa to an automatic alignment operation and a step of fixing the alignment table 13a mounting the work Wa thereon to a traverser 1 which is fixed with a photomask 8 and is displaced from the exposing section 30 to the locating section 40 by vacuum suction and checking the automatic alignment thereof, the work locating method further includes a step of displacing a forklifter 22 disposed in the exposing section to the locating section 40 to deliver an alignment table 13b mounted thereon onto an alignment stand 16 during an exposure process and allowing the forklifter to return to an original position in the exposing section 30 before the exposure process is completed, thereby performing the work locating operation with high alignment accuracy between the work and the photomask and high producibility in the automatic exposure process.

5 Claims, 10 Drawing Sheets

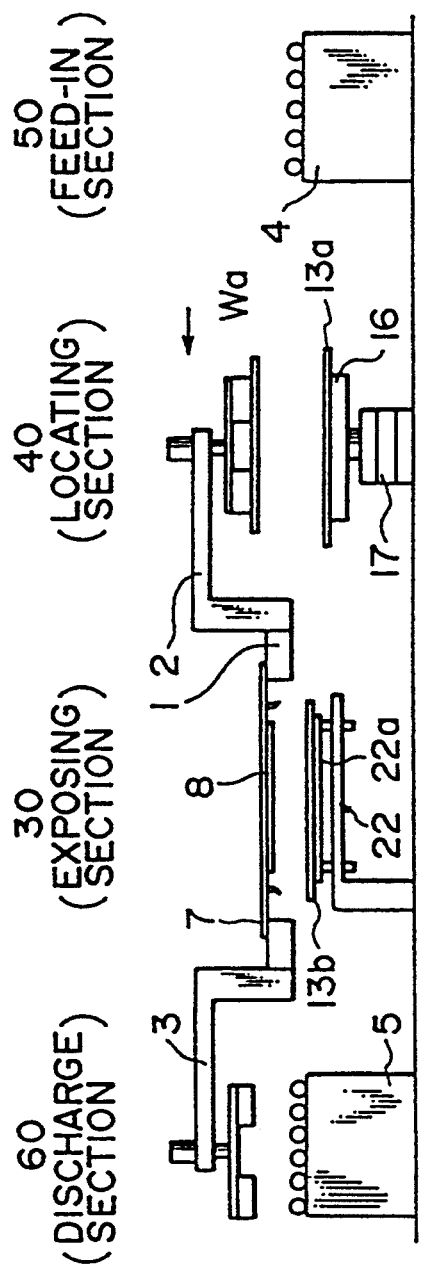
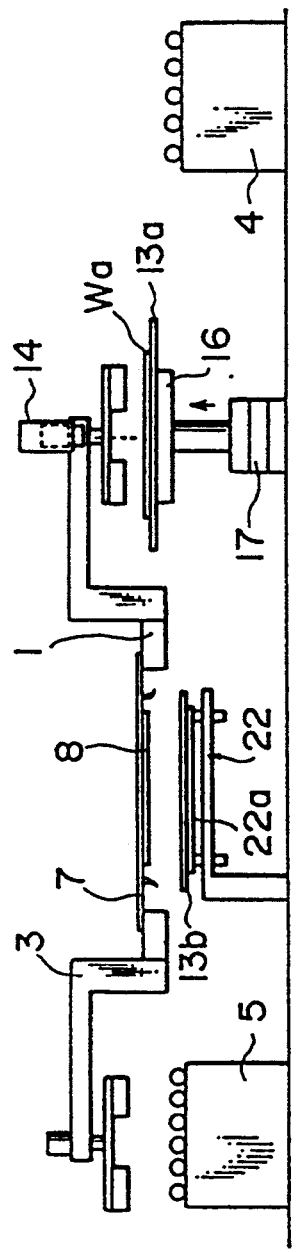
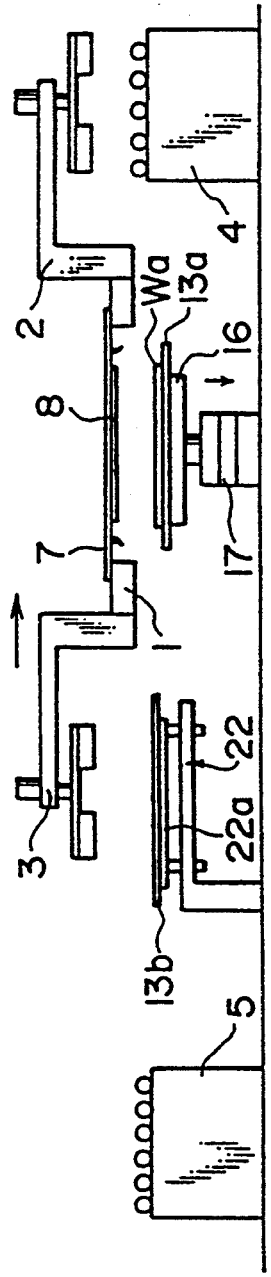
FIG. 7(A)
FIG. 7(B)
FIG. 7(C)

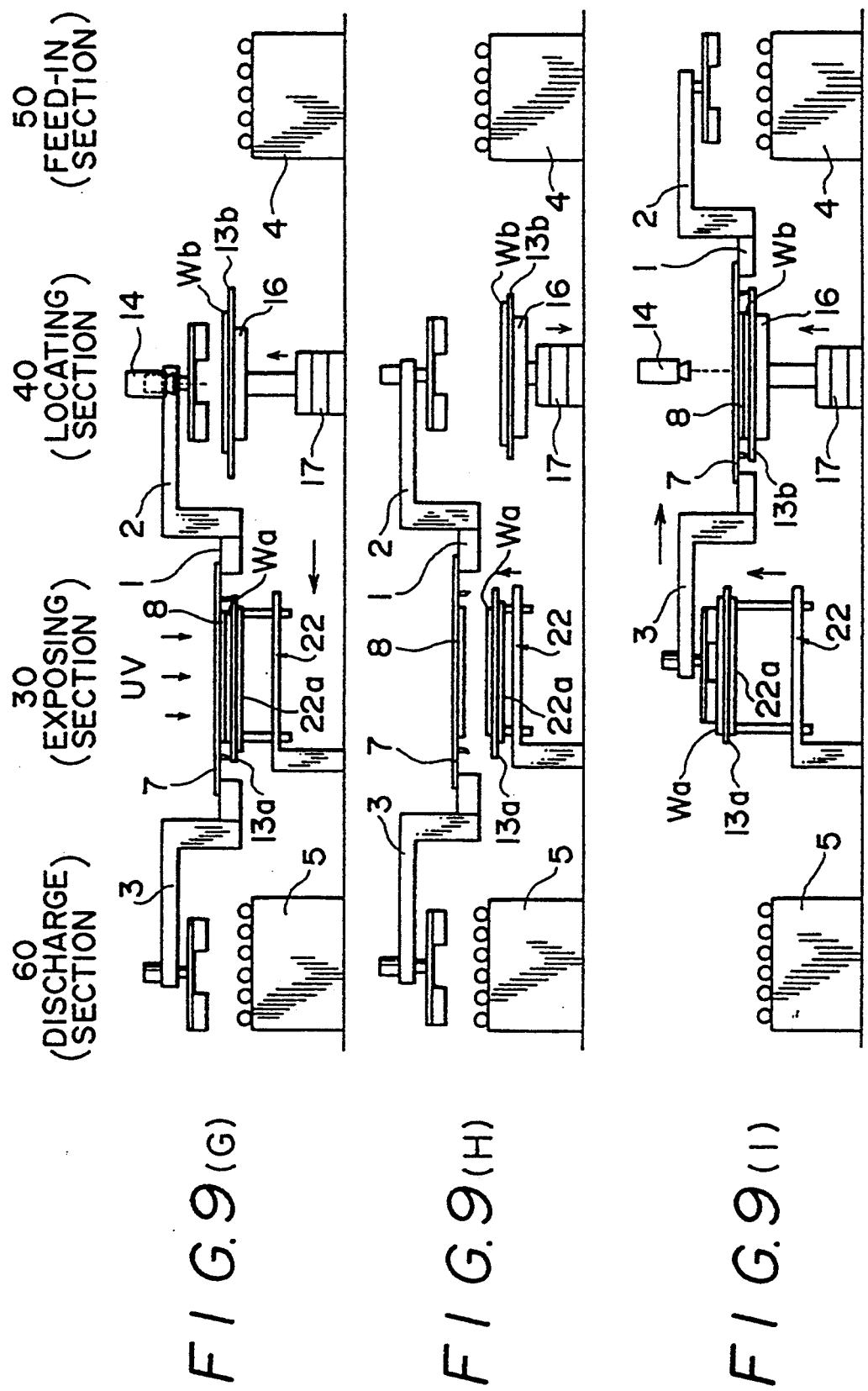

METHOD OF LOCATING WORK IN AUTOMATIC EXPOSING APPARATUS

BACKGROUND OF THE INVENTION

1. Field of the Invention

This invention relates to a work locating method for use in an automatic exposing apparatus for forming a photomask on a work such as a printed wiring board, a print board or the like.

2. Description of the Related Art

Two types of locating or positioning systems have been hitherto utilized to perform a locating or positioning operation for a conventional automatic exposing apparatus. One of the locating systems is called an "inside locating system" in which both of an exposing section for irradiating ultraviolet rays and a locating section for performing a locating or positioning operation between a mask film (or glass dry plate) and a work are disposed at the same place, and the other of the locating systems is called as "outside locating system" in which the exposing section and the locating section are disposed at different places.

The applicant of this application has already proposed "outside locating system" as disclosed in Japanese Laid-open No. Hei 1-302259 which corresponds to U.S. Pat. No. 4,996,763 entitled "METHOD OF LOCATING WORK IN AUTOMATIC EXPOSING APPARATUS". This apparatus adopts a work which is beforehand formed with alignment marks, and an automatic aligning device for reading out the alignment marks before the work is fed into an exposing chamber for an exposure process and subjecting the read-out alignment mark to an image processing to locate the work at a predetermined locating position in the exposing chamber on the basis of the processed data. In more detail, the work is fixedly positioned on an alignment table of the automatic aligning device by vacuum-suction of a suction device, and an image-recognizable camera is moved to such a position that alignment marks formed at any positions of various kinds of works can be read out through a transparent window provided at a broad area of the alignment table. Thereafter, on the basis of position information on the moving position of the camera itself and the positions of the alignment marks which are detected by the camera and located in an image receiving area of the camera, the alignment table on which the work is fixedly mounted by the vacuum suction is displaced such that the alignment marks of the work are disposed in correspondence to predetermined positions inside of the exposing chamber.

The "inside locating system" has an advantage that the alignment can be performed with high accuracy because alignment accuracy just before an exposing process is started can be confirmed, but a disadvantage that producibility is low because the aligning and exposing operations are carried out in serial sequence mode. On the other hand, the "outside locating system" has an advantage that the producibility is high because the aligning and exposing operations are carried out in a parallel series mode, but has disadvantages that the alignment accuracy is dependent on mechanical accuracy of a feeding member located between the locating section and the exposing section, that the photomask suffers thermal deformation in the exposing process, and that the alignment accuracy just before the exposing process is started can be hardly confirmed.

SUMMARY OF THE INVENTION

An object of this invention is to provide a method of locating a work in an automatic exposing apparatus in which the effect of the "inside locating system" of confirming the alignment accuracy between the photomask and the work such as a printed wiring board just before an exposing process is obtained while keeping the effect of the high producibility of the "outside locating system".

In order to attain the above object, according to one aspect of this application, a method of locating a work in an automatic exposing apparatus in which a locating section for locating the work and an exposing section are separately provided and locating and exposing operations are simultaneously carried out, comprises the steps of vacuum-suctionally fitting one of upper and lower printing frames, which is formed on a feeding member movable reciprocatively between the exposing section and the locating section, to an alignment table serving as the other printing frame on which an automatically aligned work is mounted when the feeding member is displaced from the exposing section and arrives at the locating section, detecting a positional deviation amount between the work on the fitted alignment table and a photomask of the upper printing frame, and using a detected deviation amount as a correction value of the automatic alignment for the work or a subsequently fed-in work to be subjected to the automatic alignment.

According to another aspect of this invention, a method of locating a work in an automatic exposing apparatus in which a locating section for locating the work and an exposing section are separately provided and locating and exposing operations are simultaneously carried out, comprises the steps of displacing a forklifter having a receiving stand, which is disposed in the exposing section and vertically movable, to the locating section while mounting an alignment table on the receiving stand, delivering the alignment table to an alignment stand which is provided in the locating section and is movably driven in such a manner that vertical and horizontal positions thereof are variable, and after the delivering step, allowing the forklifter to return to an original position in the exposing section just before an exposure process is completed.

As described above, this invention adopts "outside locating system" in which the exposing section and the locating section are provided separately from each other and both of the locating and exposing operations are simultaneously carried out, so that a time required for an automatic exposing process can be more shortened in comparison with "inside locating system". In addition, the alignment accuracy between the photomask and the work which are closely fixed to each other by the vacuum suction can be confirmed before an exposure process is conducted, so that if the alignment accuracy is confirmed to be sufficient, the upper and lower printing frames are displaced to the exposing section and subjected to the exposure process while fixed to each other. However, if the alignment accuracy is confirmed to insufficient, the vacuum-suction for the work is released to separate the upper and lower frames, and the locating operation is carried out again. In the locating section, the deviation amount of the alignment accuracy is recognized as a mechanical error amount, and this mechanical error amount is kept as a learned value. The coordinate values for a subsequent work which are stored in a memory for the "outside locating system" can be corrected on the basis of the learned value.

In addition, during an exposure process, the forklifter disposed in the exposing section is displaced to the locating section to deliver the alignment table mounted on the receiving stand of the forklifter to the alignment stand disposed in the locating section, and then returns to the original position in the exposing section during the exposure process, so that even if works are continuously fed into the locating section, the locating, exposing and discharging operations can be smoothly and continuously carried out using two alignment tables.

BRIEF DESCRIPTION OF THE DRAWINGS

FIGS. 7(A), 7(B) and 7(C) are schematic views of operating states of the automatic exposing apparatus in accordance with first three steps of the flowchart of FIG. 6;

FIGS. 9(G), 9(H) and 9(I) are schematic views of operating states of the automatic exposing apparatus in accordance with other steps of the flowchart of FIG. 6.

DETAILED DESCRIPTION OF THE INVENTION

An preferred embodiment of a work locating method in an automatic exposing apparatus will be described hereunder with reference to the accompanying drawings.

Figure 1:
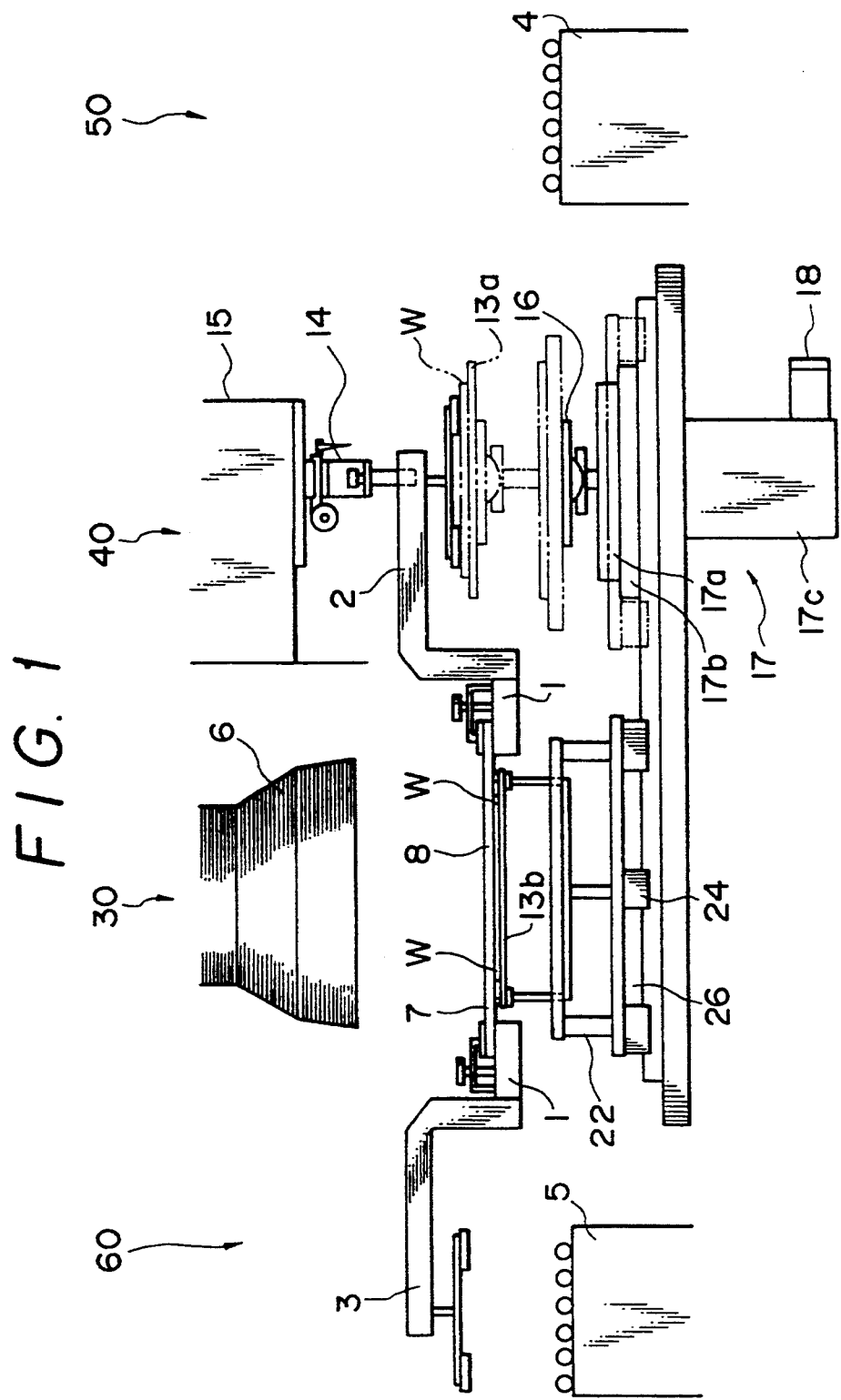
FIG. 1 is a cross-sectional plane view of an embodiment of this invention.

FIG. 1 shows an automatic exposing apparatus to which this embodiment is applied. As shown in FIG. 1, the automatic exposing apparatus includes a feed-in section 50 serving as a prealignment 4 for a work W such as a printed wiring board, a print board or the like, a locating section 40 for performing a locating or positioning operation between the work W and a mask film (photomask) 8, an exposing section 30 for irradiating ultraviolet rays from a light source 6 through the mask film 8 onto the work W, and a discharge section 60 comprising a discharge stocker 5 for stocking the exposed work W.

Figure 2:
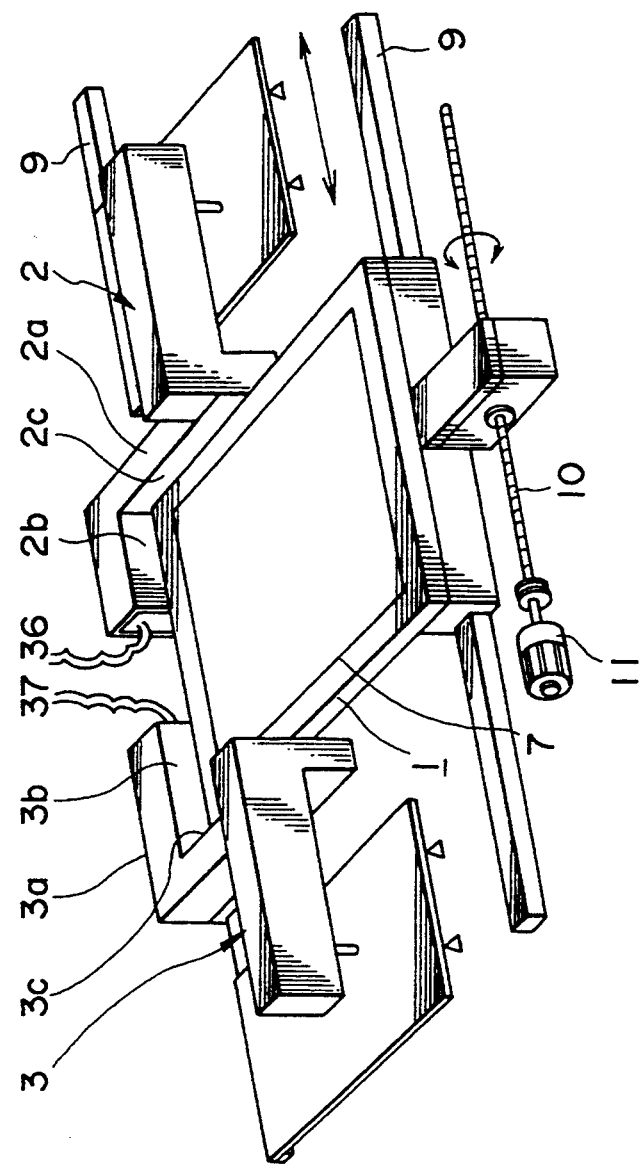
FIG. 2 is a perspective view of a traverser used in the embodiment as shown in FIG. 1.

As shown in FIG. 2, a traverser 1 serving as a feeding member is formed of a light-permeable transparent resin plate, and is provided with an upper printing frame. As shown in FIG. 1, the upper printing frame 7 is fitted with the mask film 8 at the opposite side thereof to the exposing section side. The traverser 1 is driven through a ball screw 10 by a servo motor 11 in such a manner as to be freely slidable along a linear guide 9 serving as a rail between the exposing section 30 and the locating section 40. A loader handler 2 is linked through side surfaces 2b and 2c of a member 2a having L-shaped section to a rear surface of the traverser 1 at the opposite side of the servo side or one side surface of the traverser 1, while an unloader handler 3 is linked through side surfaces 3b and 3c of a member 3a having L-shaped section to the rear surface of the traverser 1 or the other side surface of the traverser 1. Therefore, the traverser 1 is driven integrally or unitedly with the loader handler 2 and the unloader handler 3 by the servo motor 11. Reference numerals 36 and 37 represent lead lines of suction pads of the loader handler 2 and the unloader handler 3, respectively.

As shown in FIG. 1, in the locating section 40, two microscope cameras 14 are mounted on a frame body 15 to detect alignment marks which are fixed at two positions of the work W mounted on the alignment table 13a. Each of the microscope cameras 14 serves to read out a coordinate value of the alignment mark of the work W. The read-out coordinate value is compared with an imaginary mark of the mask film which is beforehand stored in a memory, thereby generating a deviation signal representing a deviation amount in position. The alignment table 13a is supported by an alignment stand 16, and the alignment stand 16 is driven by a driving mechanism 17. The driving mechanism 17 includes a X, Y-axes driving mechanism 17a having a pulse motor for moving the alignment stand 16 in X-axis and Y-axis directions, a $\theta$-rotation driving mechanism 17b having a pulse motor for rotating the alignment stand 16 in a $\theta$-rotational direction and a Z-axis driving mechanism 17c having a pulse motor for vertically moving the alignment stand 16 in a Z-axis direction. The respective pulse motors of the driving mechanism 17 are driven on the basis of the deviation signal obtained by the microscope cameras 14 to perform an automatic alignment operation of the work W. A reference numeral 18 represents a pulse linear motor for vertically driving the alignment stand 16.

Figure 3:
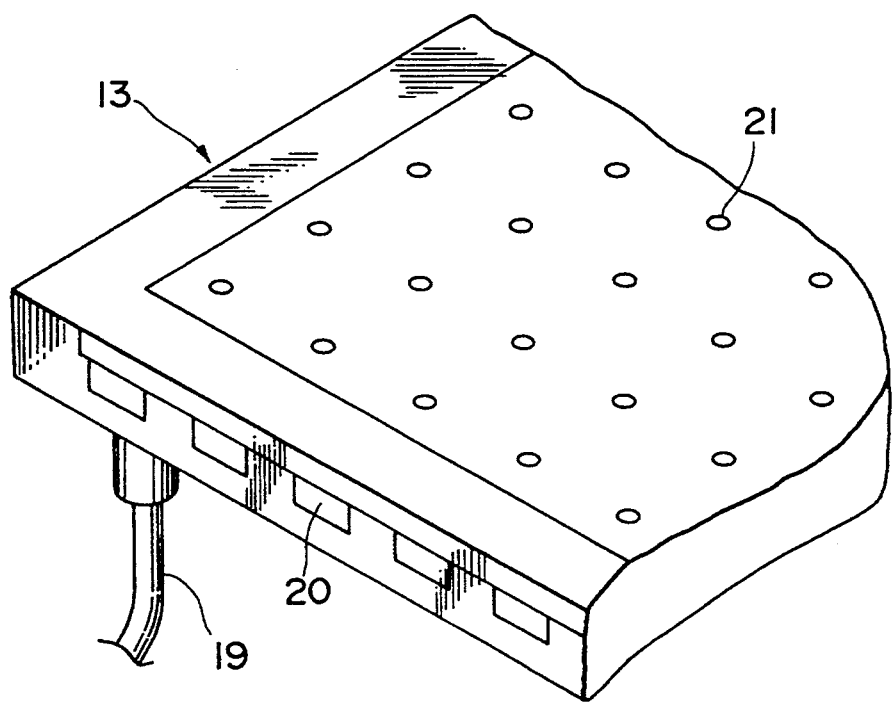
FIG. 3 is a perspective view of an alignment table used in the embodiment as shown in FIG. 1.

FIG. 3 is a perspective view of the alignment table 13. The alignment table is formed of metal plate in such a hollow structure (box structure) that an interior space is surrounded by upper (top) and lower (bottom) surfaces and side surfaces thereof. A vacuum hose 19 having one end secured to the bottom surface of the alignment table 13 is connected through an opening-and-closing valve to a vacuum source at the other end thereof, whereby vacuum suction holes 21 formed on the top surface of the alignment table 13 are intercommunicated through vacuum grooves 20 with the vacuum source.

Figure 4:
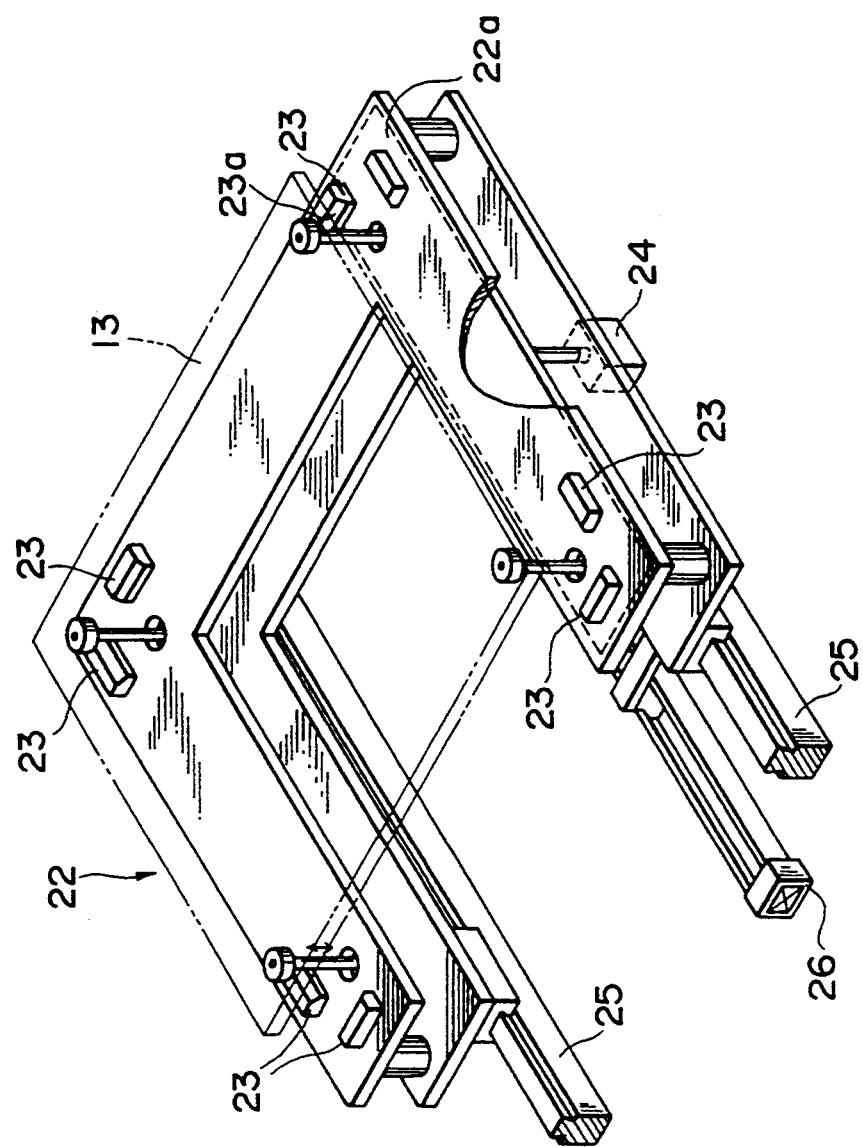
FIG. 4 is a perspective view of a forklifter of the embodiment as shown in FIG. 1.

FIG. 4 is a perspective view of the forklifter. The alignment table 13 is delivered to the forklifter 22, and automatically mounted onto a receiving stand 22a of the forklifter 22 by vacuum suction while guided along a slanted peripheral surface 23a of a Teflon block 23. The receiving stand 22a of the forklifter 22 is vertically movable by an air cylinder 24, and the forklifter 22 is driven by a rodless cylinder 26 so as to be reciprocatively movable along the linear guide 25 serving as the rail between the exposing section 30 and the locating section 40.

Figure 5:
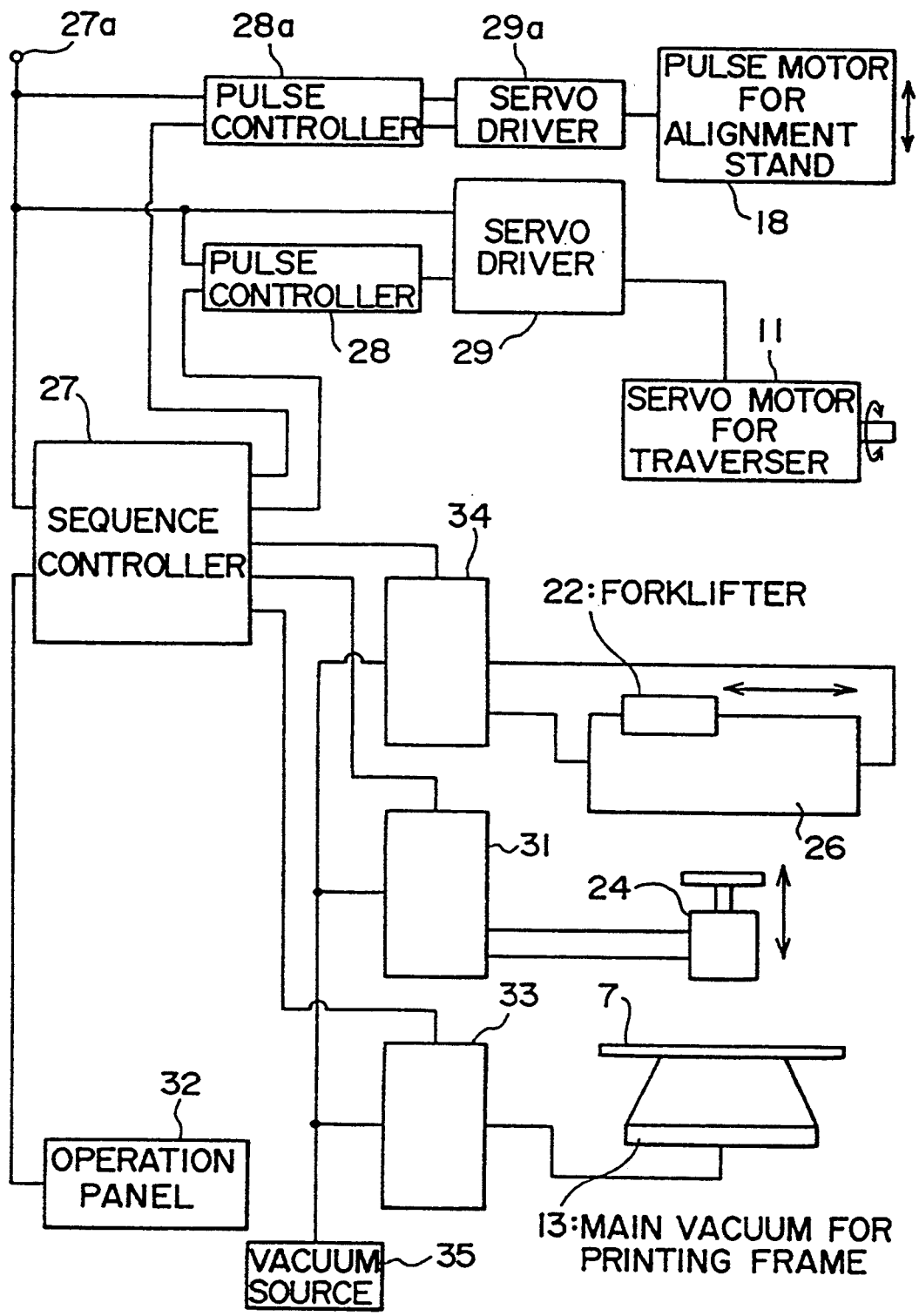
FIG. 5 is a block diagram of a control system of the embodiment of this invention.

FIG. 5 is a block diagram of the control system of the automatic locating method of this embodiment.

A sequence controller 27 has various functions of setting output conditions for various inputs on the basis of a sequence program which is beforehand stored, outputting various instructions in accordance with the output conditions, and driving the motors, the air cylinder, etc. in accordance with the output instructions. For example, the sequence controller 27 is connected through a pulse controller 28 and a servo driver 29 having pulse amplifying capability to a servo motor 11 equipped to the traverser 1, and serves to drive the servo motor 11 of the traverser 1 to reciprocatively move the traverser 1 between the exposing section 30 and the locating section 40. Likewise, the sequence controller 27 is connected through a pulse controller 28a and a servo driver 29a to a pulse linear motor 18 of the driving mechanism 17 provided to the locating section 40, and serves to drive the pulse linear motor 18 to vertically move the alignment stand 16 by which the alignment table 13 is suctionally supported. In addition, the sequence controller 27 also serves to move the alignment stand 16 in the X-axis and Y-axis directions and in the θ-rotational direction.

The sequence controller 27 is further connected to a power terminal 27a and performs a switching operation (on and off) of an input voltage from the power terminal 27a to open and close inner valves. Further, the sequence controller 27 drives the rodless cylinder 26 of the forklifter 22 through an electromagnetic valve 34 for altering a flow passageway to reciprocatively move the forklifter 22 between the exposing section 30 and the locating section 40, drives the air cylinder 24 of the forklifter 22 through an electromagnetic valve 31 to vertically move the receiving stand 22a of the forklifter 22, and enables vacuum-suction of the alignment table 13 serving a lower printing frame through an electromagnetic valve 33 to fix the sucked alignment table 13 to the upper printing frame 7 of the traverser 1 and form a printing frame. In addition, the load handler 2 and upper and lower air cylinders of the unloader handler 3 (not shown) are vacuum-sucked by the control of the sequence controller 27. A reference numeral 32 represents an operation panel, and a reference numeral 35 represents the vacuum device.

Figure 6:
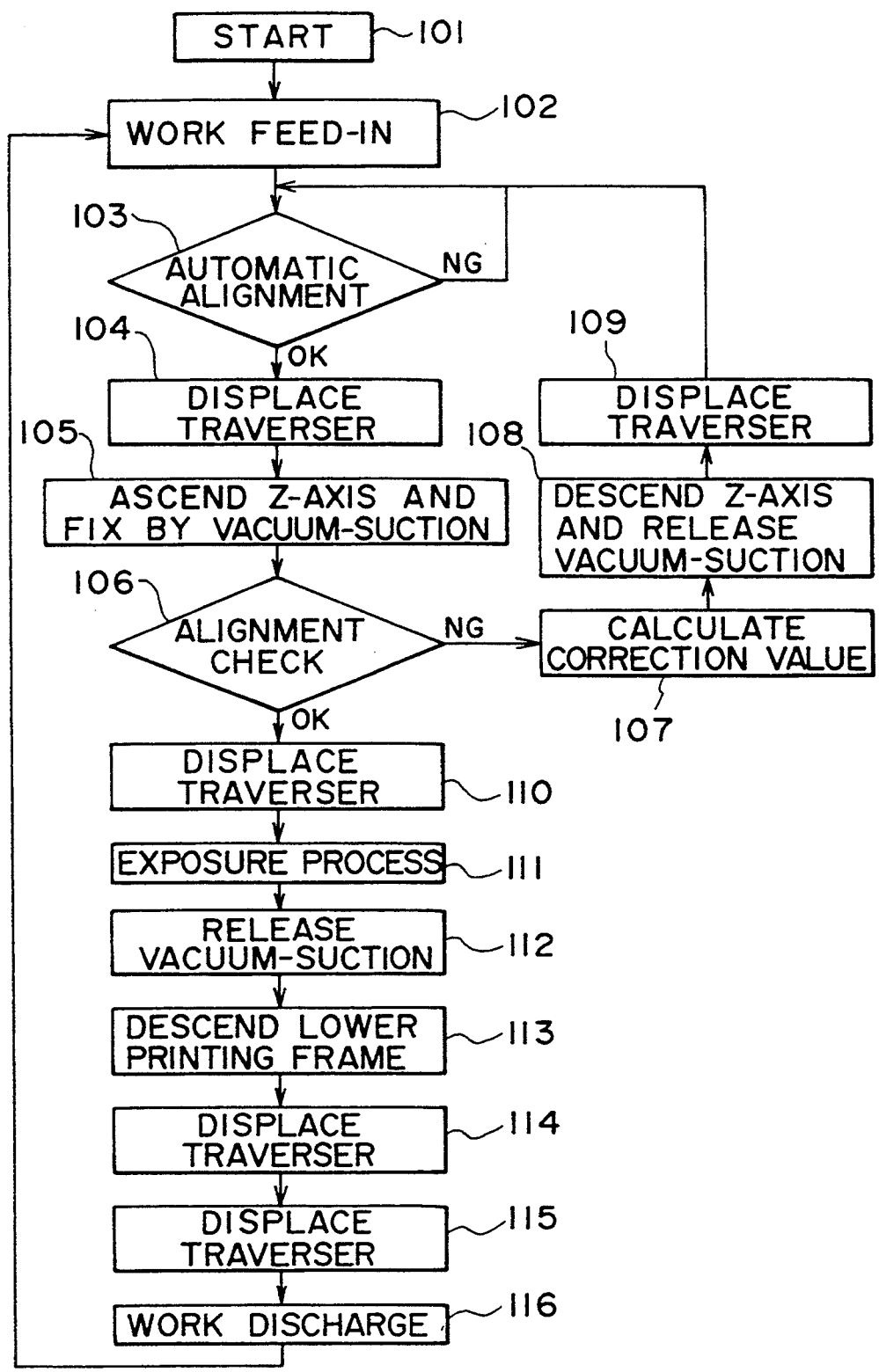
FIG. 6 is a flowchart for an operation of the embodiment of this invention.

FIG. 6 is a flowchart of the operation of the automatic locating method of this embodiment, and FIGS. 7 to 10 are schematic views of the operating states of the automatic locating apparatus in the respective steps of the flowchart.

As shown in FIG. 6, upon start of the automatic exposing apparatus (step 101), a first work Wa is fed from the feed-in section 50 to the locating section 40 by the loader handler 2, and at this time the traverser 1 is disposed at the exposing section 30 (step 102). Thereafter, the first work Wa fed into the locating section 40 is delivered onto a first alignment table 13a, and subjected to an automatic alignment operation. If the first work Wa can not be located at a predetermined position, the automatic alignment operation is repeated (step 103). When the automatic alignment operation is completed, the traverser 1 is displaced from the exposing section 30 to the locating section 40 (step 104).

In the locating section 40, the first alignment table 13a supporting the automatically-aligned first work Wa thereon is upwardly moved by ascending the alignment stand 16, and the upper printing frame 7 formed in the traverser 1 and the first alignment table 13a serving as the lower printing frame are integrally fixed to each other by the vacuum suction (step 105) to constitute a printing frame, thereafter an alignment check being carried out (step 106). Through the alignment check, if alignment accuracy is judged to be insufficient, a correction value is calculated (step 107), the Z-axis shaft of the driving mechanism 17 of the locating section 40 is downwardly moved and a vacuum state of the printing frame is released (step 108), the traverser 1 is displaced from the locating section 40 to the exposing section 30, and then the program returns to the step 103 (step 109).

At the step 106, it is judged through the alignment check that the alignment accuracy is sufficient, the traverser 1 having the printing frame in which the first work Wa is supported is displaced from the locating section 40 to the exposing section 30, and at the same time the loader handler 2 feeds a second work Wb into the locating section 40 (step 110). Thereafter, the work Wa is subjected to an exposure process in the exposing section 30, the second work Wb is subjected to the automatic alignment process in the locating section 40 (step 111), the vacuum-suction of the printing frame is released in the exposing section 30 (step 112), and then the first alignment table 13a serving as the lower printing frame is downwardly moved (step 113).

The traverser 1 is displaced from the exposing section 30 to the locating section 40, and simultaneously with this displacement of the traverser 1 the unloader handler 3 which arrives at the exposing section 30 from the discharge section 60 is coupled to the exposed first work Wa. In the locating section 40, the upper printing frame 7 of the traverser 1 arriving at the locating section 40 and the second alignment table 13b serving as the lower frame on which the second work Wb is supported, are fixed to each other by the vacuum suction, and then the alignment check is carried out for the fixed printing frame (step 114). Subsequently, the traverser 1 is displaced from the locating section 40 to the exposing section 30 (step 115). Simultaneously with this displacement of the traverser 1, the unloader handler 3 which arrives at the discharge section 60 from the exposing section 30 while supporting the first work Wa by the vacuum suction delivers the first work Wa to the discharge stocker 5 (step 116). Subsequently, the program returns to the step 102 to repeat the operations as described above.

FIG. 7(A) shows an operating state of the automatic exposing apparatus at the step 102 of the flowchart as shown in FIG. 6. In this operating state, the traverser 1 is disposed in the exposing section 30, the loader handler 2 is disposed in the locating section 40 and the unloader handler 3 is disposed in the discharge section. In the exposing section 30, the work W is not suctionally fixed to the upper printing frame 7. The forklifter 22 is disposed beneath the upper printing frame 7 while mounting the second alignment table 13b on the receiving standing 22a thereof. In the locating section 40, the first work Wa is suctionally fixed to the suction pad of the loader handler 2, and beneath the first work Wa the alignment stand 16 is supported by the driving mechanism 17 spacedly from the first work Wa.

FIG. 7(B) shows an operating state of the automatic exposing apparatus at the step 103 of the flowchart of FIG. 6. The traverser 1, the loader handler 2 and the unloader handler 3 are disposed at the same positions as shown in FIG. 7(A). In the locating section 40, the first alignment table 13a supporting the first work Wa thereon is upwardly moved to a predetermined position by the driving of the driving mechanism 17 in the Z-axis while mounted on the alignment stand 16 to deliver the first work Wa to the first alignment table 13a, and then the automatic alignment operation is carried out for the first work Wa on the first alignment table through the microscope camera 14.

FIG. 7(C) shows an operating state of the automatic exposing apparatus at the step 104 of the flowchart of FIG. 6. In this operating state, the traverser 1 is displaced to the locating section 40, the loader handler 2 is displaced to the feed-in section 50 and the unloader handler 3 is displaced to the exposing section 30. In the exposing section 30, the forklifter 22 is disposed beneath the unloader handler just displaced from the discharge 60 while mounting the second alignment table 13b thereon. In the locating section 40, the first alignment table 13a supporting the first work Wa thereon is downwardly moved to a predetermined position by the driving mechanism 17 while mounted on the alignment stand 16, and disposed beneath the upper printing frame 7 just displaced from the exposing section.

Figure 8D:
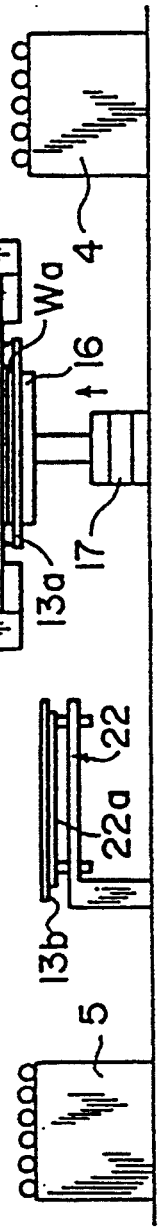
FIGS. 8(D), 8(E) and 8(F) are schematic views of operating states of the automatic exposing apparatus in accordance with other steps of the flowchart.

FIG. 8(D) shows an operating state of the automatic exposing apparatus at the steps 105 and 106 of the flowchart of FIG. 6. In this operating state, the traverser 1, the loader handler 2 and the unloader handler 3 are disposed at the same positions as shown in FIG. 7(C). In the locating section 40, in association with the upward movement of the driving mechanism 17 in the Z-axis direction, the alignment stand 16 is upwardly moved while supporting the first alignment table 13a on which the first work Wa is mounted. The first work Wa is closely attached to the mask film 8 so that the first alignment table 13a serving as the lower printing frame is integrally fixed to the upper printing frame 7 by the vacuum suction, and then the alignment check is carried out.

Figure 8E:
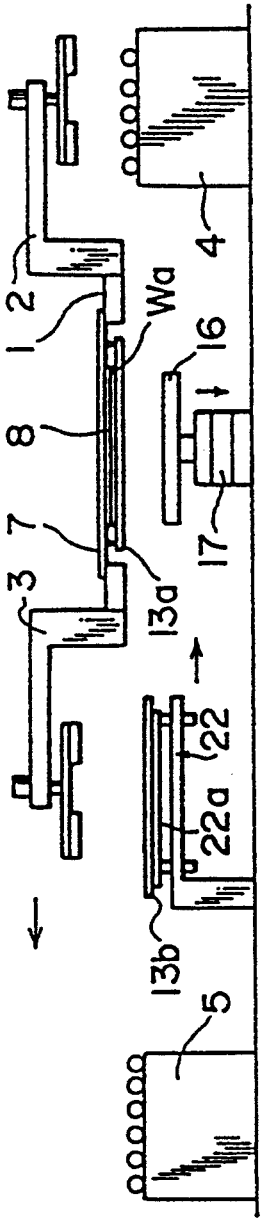

FIG. 8(E) shows an operating state of the automatic exposing apparatus at the step 110 of the flowchart of FIG. 6. In the exposing section 30, the unloader handler 3 is awaiting its displacement to the discharge section 60, and the forklifter 22 is also awaiting its displacement from the exposing section 30 to the locating section 40 along the linear guide 25 while mounting the second alignment table 13b thereon. In the locating section 40, the traverser 1 is awaiting its displacement from the locating section 40 to the exposing section 30 after the alignment stand 16 is downwardly moved. In the feed-in section 50, the loader handler 2 is awaiting its displacement from the feed-in section 50 to the locating section 40.

Figure 8F:
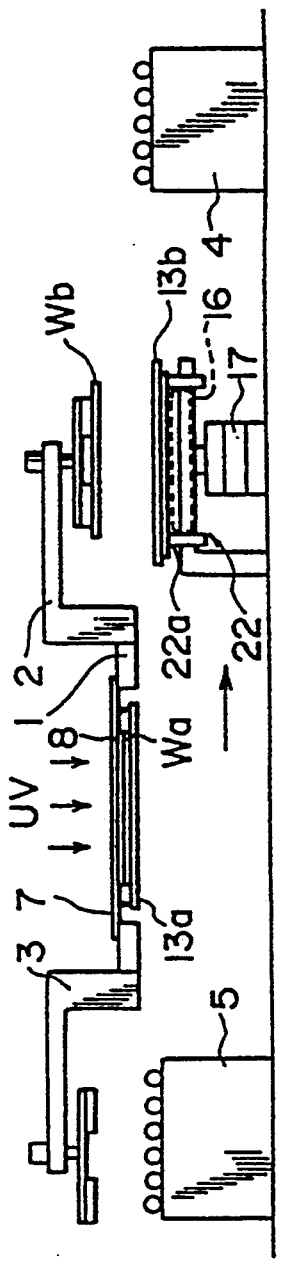

FIG. 8(F) shows an operating state of the automatic exposing apparatus at the step 111 of the flowchart of FIG. 6. In this operating state, the displacement of the traverser 1 from the locating section 40 to the exposing section 30 is completed, the displacement of the loader handler 2 from the feed-in section 50 to the locating section 40 is completed, and the displacement of the unloader handler 3 from the exposing section 30 to the discharge section 60 is completed. Further, the forklifter 22 mounting the second alignment table 13b thereon completes its displacement from the exposing section 30 onto the surface of the alignment stand 16 in the locating section 40. In the exposing section 30, the first work Wa is subjected to an exposure process by a light source lamp 6 for ultraviolet rays while sealingly sandwiched in vacuum between the upper printing frame 7 of the traverser 1 and the first alignment table 13a serving as the lower printing frame. In the locating section 40, the second alignment table 13b mounted on the forklifter 22 is mounted on the alignment stand 16 which is supported in the Z-axis by the driving mechanism 17, and disposed away from the second work Wb which is supported with vacuum suction by the unloader handler 2.

FIG. 9(G) shows an operating state of the automatic exposing apparatus at the step 111 of the flowchart of FIG. 6. In this operating state, the traverser 1, the load handler 2 and the unloader handler 3 are disposed at the same positions as shown in FIG. 8(F). As shown in FIG. 8(F), in the locating section 40, the alignment table 13b mounted on the receiving table 22a of the forklifter 22 is lifted up by the upward movement of the alignment stand 16 so that the alignment table 13b is delivered onto the alignment stand 16 from the forklifter 22. After the delivery of the alignment table 13b, the forklifter 22 is displaced from the locating section 40 beneath the upper printing frame 7 in the exposing section 30. In this state, the exposing process is continued in the exposing section 30. In the exposing section 30, the forklifter 22 displaced from the locating section 40 is upwardly moved, and the receiving stand 22a of the forklifter 22 is attached to the first alignment table 13a serving as the lower printing frame. In the locating section 40, the Z-axis of the driving mechanism 17 is upwardly moved to a predetermined position to lift up the alignment stand 16. The automatic alignment operation is carried out for the second work Wb mounted on the second alignment table 13b which is supported by the upwardly-moved alignment stand 16.

FIG. 9(H) shows an operating state of the automatic exposing apparatus at the steps 112 and 113 of the flowchart of FIG. 6. In this operating state, the traverser 1, the load handler 2 and the anloader handler 3 are disposed at the same positions as shown in FIG. 9(G). In the exposing section 30, the vacuum-suction of the printing frame of the traverser 1 is released to deliver the first work Wa to the receiving stand 22a of the forklifter 22, and the forklifter 22 descends the receiving stand 22a thereof to such a position that the traverser 1 is movable to the locating section 40. In the locating section 40, the alignment stand 16 mounting the second work Wb thereon is descended to such a position that the traverser 1 is movable.

FIG. 9(I) shows an operating state of the automatic exposing apparatus at the step 114 of the flowchart of FIG. 6. In this operating state, the traverser 1 is displaced from the exposing section to the locating section 40, the loader handler 3 is displaced from the location section 40 to the feed-in section 50, and the unloader handler 3 is displaced from the discharge section 60 to the exposing section 30. In the exposing section 30, in association with the upward movement of the arm of the forklifter 22, the first Wa on the first alignment table 13a which is supported by the receiving stand 22a is attached to the suction pad of the unloader handler 3. In the locating section 40, the driving mechanism drives its Z-axis to upwardly move the alignment stand on which the second alignment table 13b mounting the second work Wb thereon is supported, so that the second alignment table 13b serving as the lower printing frame is fixed to the upper printing frame of the traverser 1 by the vacuum suction. In this state, the alignment check for the second work Wb is carried out using the microscope camera 14.

Figure 10J:
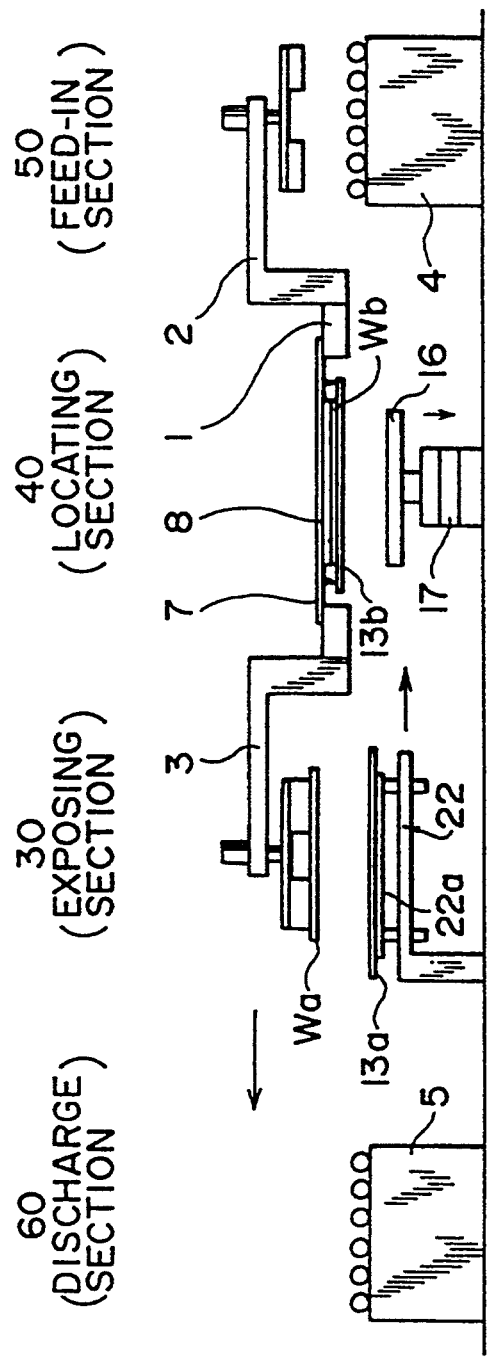
FIG. 10(J) is a schematic view of an operating state of the automatic exposing apparatus in accordance with the remaining step of the flowchart of FIG. 6.

FIG. 10(J) shows an operating state of the automatic exposing apparatus at the steps 115 and 116 of the flowchart of FIG. 6. In this operating state, the traverser 1, the loader handler 2 and the unloader handler 3 are disposed at the same positions as shown in FIG. 9(I). The traverser 1 is awaiting its displacement to the exposing section 30. In the exposing section 30, the unloader handler 3 is downwardly moved to be fixed to the first work Wa by the vacuum suction, and then upwardly moved. The forklifter 22 mounted the first alignment table 13a thereon, and is downwardly moved to such a position that the traverser 1 is movable. In the locating section 40, in association with the downward movement of the Z-axis of the driving mechanism 17, the alignment stand 16 is moved away from the second alignment table 13b which is fixedly secured to the mask film 8 by the vacuum suction. Thereafter, the traverser 1 is displaced from the locating section 40 to the exposing section 30, and the unloader handler 4 is displaced from the exposing section 30 to the discharge section 60, so that the first work Wa is discharged to the discharge stocker 5.

In the embodiment as described above, during the exposing process of the work, the forklifter is displaced from the exposing section to the locating section to deliver the alignment table mounted on the forklifter to the alignment stand equipped in the locating section, and then the forklifter returns to an original position in the exposing section. However, the feeding means of the alignment table from the exposing section to the locating section is not limited to the forklifter, and any means may be used insofar as it feeds the alignment table to the alignment stand by the time when the exposing process is completed.

The work locating method according to this invention for use in the automatic exposing apparatus in which the locating section for locating the work and the exposing section are separately provided and the locating operation and the exposing operation are simultaneously carried out, includes a step of vacuum-suctionally fitting one of upper and lower printing frames, which is formed on a feeding member movable reciprocatively between the exposing section and the locating section, to the alignment table serving as the other printing frame on which the automatically-aligned work is mounted when the feeding member is displaced from the exposing section and arrives at the locating section, a step of detecting a positional deviation amount between the work on the fitted alignment table and a photomask of the upper printing frame, and a step of using a detected deviation amount as a correction value of the automatical alignment for the work or a subsequently fed-in work to be subjected to the automatical alignment. In addition, during the exposure process, the forklifter in the exposing section is displaced to the locating section to deliver the alignment table mounted on the receiving stand thereof to the alignment stand in the locating section, and then returns to the original position before the exposure process is completed. Therefore, in comparison with the conventional "inside locating system" which provides alignment accuracy of ±15 μm and producibility of one work per 45 seconds and the conventional "outside locating system" which provides alignment accuracy of ±30 μm and producibility of one work per 20 seconds, the method according to this invention can continuously produce works with alignment accuracy of ±15 μm and producibility of one work per 20 seconds.

What is claimed is:

1. A method of locating work in an automatic exposing apparatus, said method comprising the steps of:
   transferring a work from a feed-in section into a locating section by reciprocal movement of a feeding member along a path between said locating section and an exposing section, said feed-in section prealigning said work, said locating section aligning said work with respect to a printing frame, said printing frame including a plurality of lower printing frames and an upper printing frame fixed to said feeding member, said exposing section irradiating said work in said printing frame, said locating section is separated from said exposing section and aligning as well as irradiating occurring concurrently;
   receiving said work on a first one of said plurality of lower printing frames;
   transferring said feeding member along said path to position said upper printing frame in said locating section above said first lower printing frame;
   aligning said work on said first lower printing frame with respect to said upper printing frame, said securing said first lower printing frame to said upper printing frame and said feeding member;
   transferring said work in said printing frame into said exposing section by reciprocal movement of said feeding member along said path, and concurrently transferring a second one of said plurality of lower printing frames from said exposing section to said locating section by a forklifter;
   exposing said work in said printing frame in said exposing section, and concurrently returning said forklifter to said exposing section;
   separating said upper printing frame from said work on said first lower printing frame, said forklifter receiving said work on said first lower printing frame; and
   transferring said work out of said exposing section by reciprocal movement of said feeding member along said path.

2. The method of locating a work in an automatic exposing apparatus according to claim 1, wherein said fist lower printing frame and said upper printing frame are secured with respect to one another by vacuum-suction.

3. The method of locating a work in an automatic exposing apparatus according to claim 1, wherein said aligning includes displacing and rotating said work on said first lower printing frame with respect to said upper printing frame.

4. The method of locating a work in an automatic exposing apparatus according to claim 3, wherein said displacing occurs along a plurality of orthogonal axes.

5. The method of locating a work in an automatic exposing apparatus according to claim 1, further comprising:
   detecting positional deviation between said work on said first lower printing frame and said upper printing frame; and
   correcting said aligning of subsequent work based on said positional deviation.

* * * * *